United States Patent

Long

[11] Patent Number: 5,110,411
[45] Date of Patent: May 5, 1992

[54] METHOD OF ISOTROPICALLY DRY ETCHING A POLY/WSI$_x$ SANDWICH STRUCTURE

[75] Inventor: Paul Long, Boise, Id.
[73] Assignee: Micron Technology, Inc., Boise, Id.
[21] Appl. No.: 516,053
[22] Filed: Apr. 27, 1990
[51] Int. Cl.$^5$ .......................................... H01L 21/00
[52] U.S. Cl. ................... 156/656; 156/646; 156/643; 156/657; 156/659.1; 156/662
[58] Field of Search .............. 156/646, 643, 657, 656, 156/659.1, 662

[56] References Cited

U.S. PATENT DOCUMENTS

| | | | |
|---|---|---|---|
| 4,468,285 | 8/1984 | Bayman et al. | 156/646 |
| 4,473,436 | 9/1984 | Beinvogl | 156/643 |
| 4,477,310 | 10/1984 | Park et al. | 156/643 |
| 4,502,913 | 3/1985 | Lechaton et al. | 156/643 |
| 4,666,555 | 5/1987 | Tsang | 156/643 |
| 4,713,141 | 12/1987 | Tsang | 156/646 |
| 4,741,799 | 5/1988 | Chen et al. | 156/646 |
| 4,778,563 | 10/1989 | Stone | 156/646 |
| 4,824,802 | 4/1989 | Brown et al. | 437/187 |
| 4,836,887 | 6/1989 | Daubenspeck et al. | 156/646 |

OTHER PUBLICATIONS

Plasma Etching in Semiconductor Fabrication (Plasma Technology I) by Russ A. Morgan © 1985—Elsevier, Amsterdam; pp. 15–42.
M. P. E. P., pp. 600-46 to 600-47.
"Plasma Etching In Semiconductor Fabrication"; by Russ A. Morgan; © 1985; Elsevier Co.; NY, NY.
Wolf et al., "Silicon Processing For The VLSI Era—vol. 1: Process Technology", pp. 551–557.
Flamm et al., "The Design of Plasma Etchants", (1981) pp. 317–363.
Mogab, "VLSI Technology", pp. 303–342.

*Primary Examiner*—David A. Simmons
*Assistant Examiner*—George Goudreau
*Attorney, Agent, or Firm*—Wells, St. John & Roberts

[57] ABSTRACT

Disclosed is a method of isotropically dry etching a WSi$_x$/polysilicon sandwich structure on a silicon substrate wafer containing integrated semiconductor circuits. The method is conducted within a parallel plate reactor which in operation provides a substantially constant power density over the parallel plates. The reactor parallel plates are spaced a preselected separation distance from one another and a preselected amount of electrical power is applied thereto. Gases are injected to within the reactor provide a reactive gas mixture at a preselected pressure. The reactive gas mixture comprises SF$_6$, Cl$_2$, and O$_2$ in approximate respective volume ratios of 7.0±5%:5.0±5%:4.0±5%. The wafer is subjected to the reactive gas mixture at the preselected pressure for a preselected amount of time to selectively obtain a desired isotropic etch of the WSi$_x$/polysilicon.

13 Claims, 2 Drawing Sheets

METHOD OF ISOTROPICALLY DRY ETCHING A POLY/WSI$_x$ SANDWICH STRUCTURE

TECHNICAL FIELD

The invention relates to a method of isotropically dry etching a WSi$_x$/polysilicon sandwich structure using a parallel plate reactor.

BACKGROUND OF THE INVENTION

Integrated circuits are chemically and physically integrated into a substrate, such as a silicon wafer, by patterning regions in the substrate, and by patterning layers on the substrate. These regions and layers can be conductive, for conductor and resistor fabrication. They can also be of different conductivity types, which is essential for transistor and diode fabrication.

Deposited conductors are an integral part of every integrated circuit, and provide the role of surface wiring for conducting current. Specifically, the deposited conductors are used to wire together the various components that are formed in the surface of the wafer. Such conductors are commonly known as "lines" or "runners". Conductors also provide other functions in integrated circuit structures, such as fuses and backside electrical contacts for the packaged die.

The conductive lines or runners are preferably formed of a highly electrically conductive material, such as metal. Another common conductive material for producing the surface wiring effect is polysilicon (hereafter poly). A concern in forming poly lines or runners is to protect the immediate area on either side of the runner from the next implant step. FIG. 1 diagrammatically illustrates in an enlarged and exaggerated sectional view a doped poly runner 12 which has been provided atop a thin SiO$_2$ layer 11 on a doped silicon substrate 10. A photoresist mask layer 14 is provided atop the poly and is dimensioned to have a greater width than the desired finished width of the poly runner. As illustrated, this leaves a resist overhang on either side of poly runner 12 due to the greater width of the resist layer compared to that of poly runner 12.

This structure can be provided by isotropically dry etching the poly within a parallel plate reactor. A desired chemically reactive gas mixture is provided within such a reactor, and the mixture energized to a plasma state. The chemically reactive mixture is designed to be reactive with the poly, but not the photoresist nor the silicon dioxide layer atop the substrate. The effect is to etch the poly runner to a narrower width beneath photoresist 14, as indicated by isotropic etching lines A. The term "isotropic etch" is an accepted term within the semiconductor industry which indicates an etching process which removes unmasked material in both a downward and sideward direction, as shown. Conversely, the term "anisotropic etch" defines an etching process which doesn't attack the masked material from the side, but merely etches in a downward direction. The isotropic etch of FIG. 1 is relatively simple since there is just one material being etched, namely the poly. The goal is to continue the etch until the poly runner is of the desired width. At the completion of the etch, an ion implantation would take place, the resist would then be removed, and the wafer would continue on through other process steps.

As the size of the integrated circuit shrinks, the speed that the current flows along the conductive runners becomes a critical issue. One way of increasing the speed of a poly runner is to deposit a more highly conductive metal silicide layer atop the poly. This invention concerns a particular metal silicide, namely WSi$_x$. Such a layered poly lowers the total resistance of the runner.

The process of isotropically etching a WSi$_x$/polysilicon sandwich is difficult because of the different etch characteristics of poly and tungsten (W). One of the usual outcomes of trying to etch both of these levels at the same time is presented in FIG. 2 where a tungsten layer 16 is etched at a faster rate than underlying poly layer 12. Dependent upon etch chemistry and etch processing parameters, the opposite problem is presented in FIG. 3 where the poly etch rate is much faster than the tungsten etch rate.

One of the ways that these problems have been overcome is by use of an anisotropic etch as illustrated in FIG. 4. Here, the resist is provided such that there would be no overhang of the finished width of the runner, with the anisotropic etch exemplified by lines B resulting in vertical sidewalls as illustrated. The resist would then be removed and the wafer passed through a spacer process to leave a small amount of oxide 18 on both sides of the conductive runner, as illustrated in FIG. 5. Oxide 18 acts as an implant block to provide the same function that a resist overhang does in an isotropic etch. However, this method involves several extra processing steps.

One object of this invention is to produce an isotropic etching effect in a WSi$_x$/polysilicon sandwich structure beneath a layer of photoresist to provide a photoresist overhang of the finished width WSi$_x$/polysilicon width runner.

BRIEF DESCRIPTION OF THE DRAWINGS

The preferred embodiment of the invention is illustrated in the accompanying drawings, in which.

DETAILED DESCRIPTION OF THE PREFERRED EMBODIMENTS

Figure 1:
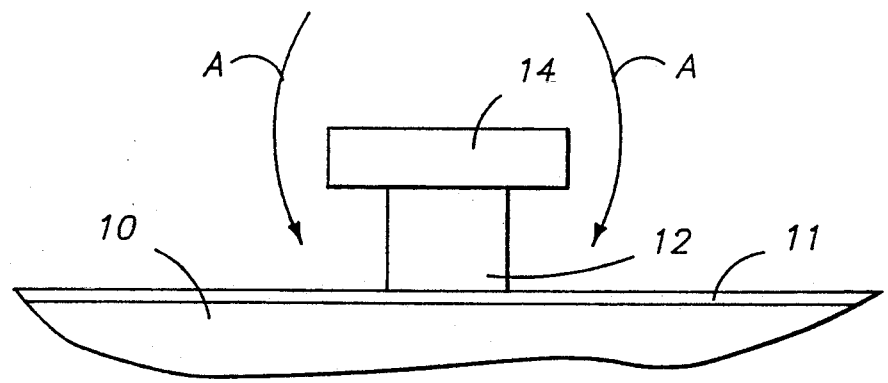
FIGS. 1–5 are enlarged diagrammatic sectional views of a semiconductor wafer having a conductive runner layered thereon, and are discussed in the Background section of this document above.
Figure 2:
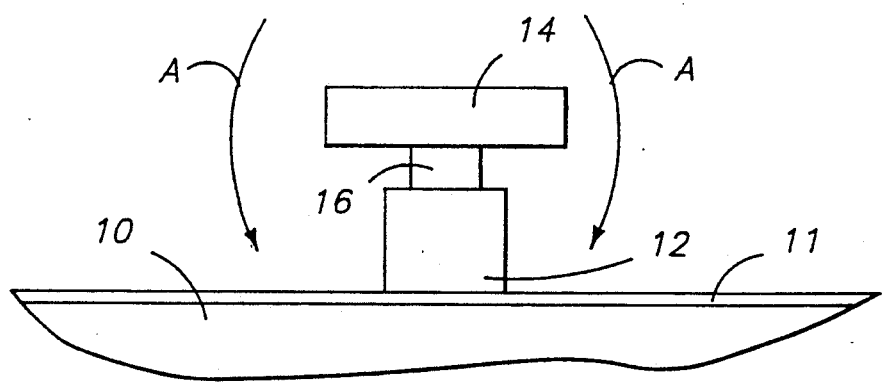
Figure 3:
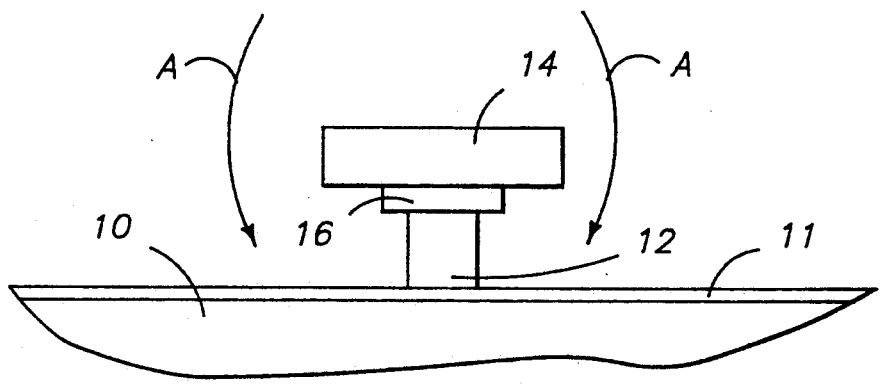
Figure 4:
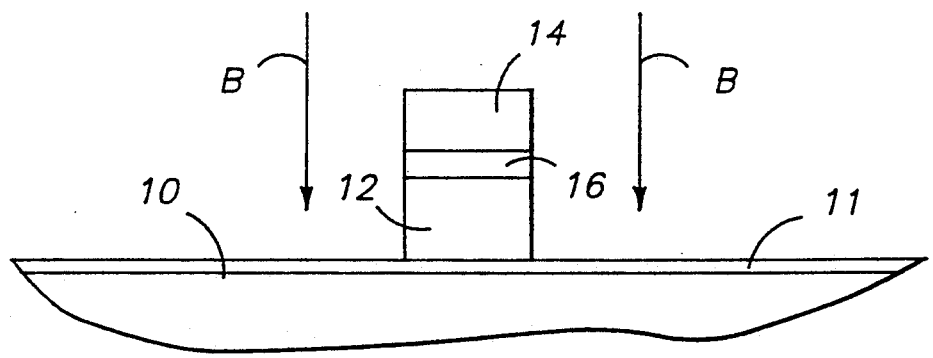
Figure 5:
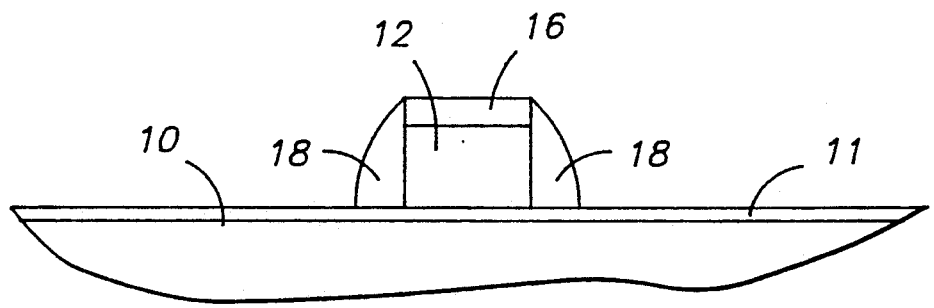

The following disclosure of the invention is submitted in furtherance with the constitutional purpose of the Patent Laws "to promote the progress of science and useful arts" (Article 1, Section 8).

The invention comprises a method of isotropically dry etching a WSi$_x$/polysilicon sandwich structure atop a silicon substrate wafer containing integrated semiconductor circuits and having an upper layer of SiO$_2$. The process is preferably conducted with the WSi$_x$/polysilicon sandwich structure lying beneath a layer of photoresist, with the photoresist having a greater width than the desired finished width of the WSi$_x$/polysilicon runner to produce an overhang. The method is conducted within a parallel plate reactor which in operation provides a continuous power density over the parallel plates of the reactor. The preferred reactor, and the reactor under which the invention has been reduced to practice, is the model LAM 480 reactor manufactured by the LAM Research Corporation of Fremont, Calif.

The parallel plates of the reactor are spaced a preselected separation distance from one another and a preselected amount of electrical power is applied to the plates. The preferred separation distance between the plates is about 1.5±0.25 cm., with power being provided to produce a density at the parallel plates of about 2.98±0.5 W/cm². Reactors having the plates set at fixed positions (nonadjustable) would also be usable in accordance with the invention.

$SF_6$, $Cl_2$ and $O_2$ are injected to within the reactor to provide a reactive gas mixture at a preselected pressure. The flow rates to the reactor of the gases are such to provide approximate respective volume ratios of $SF_6$, $Cl_2$, and $O_2$ of 7.0±5%:5.0±5%:4.0±5%. Preferably an inert carrier gas, such as helium, is injected into the reactor with the $SF_6$, $Cl_2$, and $O_2$ gases that form the reactive gas mixture. The inert carrier gas is preferably injected to provide approximate respective volume ratios of $SF_6$, $Cl_2$, $O_2$ and inert carrier gas of 7.0±5%:5.0±5%:4.0±5%:10.0±5%. The preferred predetermined pressure within the reaction chamber is preferably about 500±25 mtorr. The preferred flow rates that were demonstrated with the LAM 480 are about 35.0±1.75, 25.0±1.25, and 20.0±1.0, and 50.0±2.5 standard cubic centimeters per minute (sccm) of $SF_6$, $Cl_2$, $O_2$ and inert carrier gas, respectively.

The wafer is subjected to the reactive gas mixture within the reactor vessel at the preselected pressure for a predetermined amount of time to selectively obtain a desired etch of the $WSi_x$/polysilicon. The amount of time within the reactor will determine the amount of material to be etched, and correspondingly the width of the finished runner. Etch timing is important to provide the correct critical dimensions for the width of the runners. For example, an etch of a word line runner for an typical LDD CMOS transistor is approximately 1.1 μm wide and must stop on a 250 angstrom thick layer of oxide to form the transistor gate. A fixed exposure for such an alignment was not determined at this writing, and would be determined after experimentation to provide the correct etching critical dimensions. The above etch chemistry is selective to the thin gate oxide material which would typically underlie the poly in such a LDD transistor. It is also selective to the substrate and photoresist materials. As such, the etch will not remove these materials, but only the $WSi_x$/polysilicon under the desired operating conditions.

Figure 6:
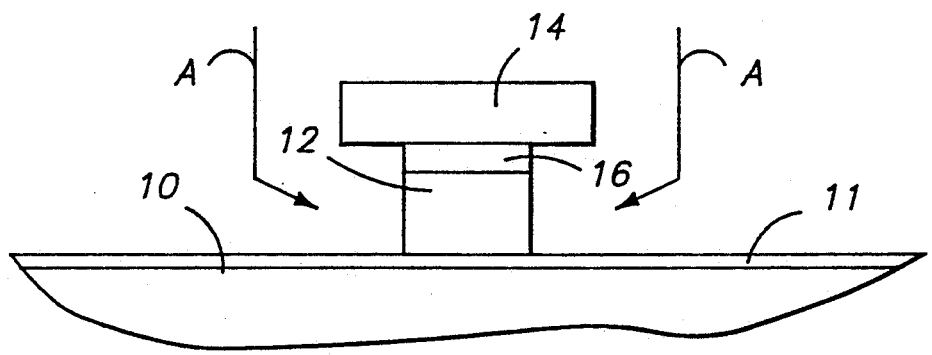
FIG. 6 is a diagrammatic sectional view of a substrate and WSi$_x$/polysilicon sandwich structure produced in accordance with aspects of the invention.

The above process will etch both the tungsten and poly at the same rate to enable producing an anisotropic etching effect beneath the resist and atop the $SiO_2$ layer 11, as illustrated by FIG. 6. The desired etching is conducted in a single step within the reactor to thereby produce the desired structure for the etch on the substrate. The substrate is then immediately ready for a next processing step after the etch.

The invention was reduced to practice in a LAM 480 operating at 500 mtorr, 150 watts of input power, 1.5 cm gap between the parallel plates, with gas feeds of 20 sccm of $O_2$, 50 sccm of He, 35 sccm of $SF_6$, and 2.5 sccm of $Cl_2$. The etch was conducted for approximately 60 seconds, with the finished width of the $WSi_x$/polysilicon sandwich runner being 1.10 μm. The overlying resist width was 1.75 μm, and remained unchanged during the process to produce a structure such as illustrated in FIG. 6.

In compliance with the statute, the invention has been described in language more or less specific as to structural and methodical features. It is to be understood that the invention is not limited to the specific features shown and described, since the means and construction disclosed comprise a preferred form of putting the invention into effect. The invention is, therefore, claimed in any of its forms or modifications within the proper scope of the appended claims appropriately interpreted in accordance with the doctrine of equivalents.

I claim:

1. A method of isotropically dry etching a $WSi_x$/polysilicon sandwich structure atop a silicon substrate wafer containing integrated semiconductor circuits, the sandwich structure having an overlying photoresist masking portion, the method being conducted within a parallel plate reactor which in operation provides a continuous power density over the parallel plates, the method comprising:

spacing the reactor parallel plates a preselected separation distance from one another and applying a preselected amount of electrical power to the parallel plates;

injecting gases to within the reactor to provide a reactive gas mixture at a preselected pressure within the reactor, the reactive gas mixture comprising $SF_6$, $Cl_2$, and $O_2$ in approximate respective volume ratios of 7.0±5%:5.0±5%: 4.0±5%; and subjecting the wafer to the reactive gas mixture at the preselected pressure for a preselected amount of time to isotropically etch the $WSi_x$ and polysilicon beneath the photoresist masking portion at substantially the same rate and provide a $WSi_x$/polysilicon runner having substantially vertical sides and having resist overhang projecting laterally from the vertical sides of the $WSi_x$/polysilicon runner.

2. The method of isotropically dry etching of claim 1 wherein the separation distance between the reactor plates is about 1.5±0.25 cm. and the power density produced at the parallel plates is about 2.98 W/cm².

3. The method of isotropically dry etching of claim 1 wherein the predetermined pressure is about 500±25 mtorr.

4. The method of isotropically dry etching of claim 1 wherein, the separation distance between the reactor plates is about 1.5±0.25 cm. and the power density produced at the parallel plates is about 2.98 W/cm²; and the predetermined pressure is about 500±25 mtorr.

5. The method of isotropically dry etching of claim 1 further comprising injecting an inert carrier gas into the reactor with the gases that form the reactive gas mixture.

6. The method of isotropically dry etching of claim 5 wherein the inert gas is injected to provide a gas mixture within the reactor comprising $SF_6$, $Cl_2$, $O_2$, and inert carrier gas in approximate respective volume ratios of 7.0±5%:5.0±5%:4.0±5%:10.0±5%.

7. The method of isotropically dry etching of claim 1 wherein, the separation distance between the reactor plates is about 1.5±0.25 cm. and the power density produced at the parallel plates is about 2.98 W/cm²;

the predetermined pressure is about 500±25 mtorr; and further comprising:

injecting an inert carrier gas into the reactor with the gases that form the reactive gas mixture.

8. The method of isotropically dry etching of claim 7 wherein the inert gas is injected to provide a gas mixture within the reactor comprising $SF_6$, $Cl_2$, $O_2$, and inert carrier gas in approximate respective volume ratios of 7.0±5%:5.0±5%:4.0±5%:10.0±5%.

9. The method of isotropically dry etching of claim 1 wherein the gases are injected at respective $SF_6$, $Cl_2$, and $O_2$ flow rates of about 35.0±1.75, 25.0±1.25, and 20.0±1.0 standard cubic centimeters per minute.

10. The method of isotropically dry etching of claim 9 further comprising injecting an inert carrier gas into the reactor with the gases that form the reactive gas mixture, the inert carrier gas being injected into the reactor at a flow rate of about 50.0±2.5 standard cubic centimeters per minute.

11. The method of isotropically dry etching of claim 9 wherein the predetermined pressure is about 500±25 mtorr.

12. The method of isotropically dry etching of claim 9 wherein the separation distance between the reactor plates is about 1.5±0.25 cm. and the power density produced at the parallel plates is about 2.98 $W/cm^2$.

13. The method of isotropically dry etching of claim 1 further comprising conducting the desired etching of the $WSi_x$/polysilicon sandwich structure in a single step within the reactor to produce a desired structure on the substrate, with the substrate then being immediately ready for a next processing step.

* * * * *